United States Patent
Hsu et al.

(10) Patent No.: US 9,543,464 B2
(45) Date of Patent: Jan. 10, 2017

(54) METHOD OF MAKING A LIGHT EMITTING DEVICE AND A LIGHT EMITTING DEVICE MADE THEREOF

(71) Applicant: Epistar Corporation, Hsinchu (TW)

(72) Inventors: Ming-Chi Hsu, Hsinchu (TW);
Chih-Ming Wang, Hsinchu (TW);
Chien-Yuan Wang, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

(21) Appl. No.: 14/678,700

(22) Filed: Apr. 3, 2015

(65) Prior Publication Data
US 2015/0214419 A1   Jul. 30, 2015

Related U.S. Application Data

(63) Continuation of application No. 13/570,558, filed on Aug. 9, 2012, now abandoned.

(51) Int. Cl.
| H01L 33/00 | (2010.01) |
| H01L 21/00 | (2006.01) |
| H01L 33/50 | (2010.01) |

(52) U.S. Cl.
CPC .......... *H01L 33/005* (2013.01); *H01L 33/505* (2013.01); *H01L 33/0095* (2013.01); *H01L 2224/48463* (2013.01); *H01L 2224/49107* (2013.01); *H01L 2933/0025* (2013.01); *H01L 2933/0041* (2013.01)

(58) Field of Classification Search
CPC .... H01L 27/30; H01L 27/3239; H01L 31/143; H01L 31/162; H01L 33/08; H01L 33/18; H01L 33/24; H01L 51/5032; H01L 27/302

USPC ..... 257/13, 79–103, 918, 40, 642–643, 759, 257/E51.018–E51.022, E33.054, E25.028, 257/E25.032, E31.058, E31.063, E31.115, 257/E27.133–E27.139
See application file for complete search history.

(56) References Cited

U.S. PATENT DOCUMENTS

| 7,066,623 | B2 | 6/2006 | Lee et al. | |
|---|---|---|---|---|
| 8,038,497 | B2 | 10/2011 | Toquin | |
| 2006/0133443 | A1* | 6/2006 | Chua | H01S 5/0425 372/50.121 |
| 2009/0051301 | A1* | 2/2009 | Garufo | H05B 33/0827 315/313 |
| 2009/0156918 | A1 | 6/2009 | Davis et al. | |
| 2010/0151604 | A1 | 6/2010 | Kal et al. | |
| 2011/0001155 | A1 | 1/2011 | Hsu | |
| 2011/0062479 | A1* | 3/2011 | Sugano | H01L 33/0095 257/98 |
| 2011/0284822 | A1* | 11/2011 | Jung | H01L 33/505 257/13 |
| 2011/0315952 | A1 | 12/2011 | Yan et al. | |
| 2012/0032196 | A1 | 2/2012 | Sato et al. | |

(Continued)

*Primary Examiner* — Julio J Maldonado
*Assistant Examiner* — Moin Rahman
(74) *Attorney, Agent, or Firm* — Ditthavong & Steiner, P.C.

(57) ABSTRACT

The method includes preparing a plurality of light-emitting units, one of the plurality of light-emitting units comprising an electrode, a light-emitting stack, and a protection layer with a first part covering the electrode and a second part which comprises a portion surrounding the electrode and covers the light-emitting stack; removing the portion without removing the first part; forming a wavelength conversion layer on the first part and the light-emitting stack not covered by the second part; and removing the first part to substantially expose the electrode.

16 Claims, 8 Drawing Sheets

(56) References Cited

U.S. PATENT DOCUMENTS

2012/0068210 A1    3/2012  Chou
2012/0193670 A1    8/2012  Son et al.
2013/0075774 A1*   3/2013  Haase .................... H01L 33/50
                                                    257/98

* cited by examiner

METHOD OF MAKING A LIGHT EMITTING DEVICE AND A LIGHT EMITTING DEVICE MADE THEREOF

CROSS REFERENCE TO RELATED APPLICATION

This present application is a continuation patent application of U.S. patent application, Ser. No. 13/570,558, filed on Aug. 9, 2012, and now abandoned, and the content of which is hereby incorporated by reference in its entirety.

BACKGROUND

1. Technical Field

The present disclosure relates to a method of making a light-emitting device, and in particular to a method comprising forming a protection layer on each of light-emitting units on a single wafer.

2. Description of the Related Art

The light-emitting diodes (LEDs) of the solid-state lighting elements have the characteristics of low power consumption, low heat generation, long operational life, shock-proof, small volume, quick response and good opto-electrical property like light emission with a stable wavelength, so the LEDs have been widely used in household appliances, indicator light of instruments, and opto-electrical products, etc.

A phosphor material is widely used on blue LEDs to generate a white light LED. When manufacturing the white light LED, since blue LEDs have different emission wavelengths and optical powers, it is difficult to obtain a desired CIE coordinate for each blue LEDs on a single wafer.

In addition, the white light LED can be further connected to other components in order to form a light emitting apparatus. The white light LED may be mounted onto a submount with the side of the substrate, or a solder bump or a glue material may be formed between the submount and the white light LED, therefore a light-emitting apparatus is formed. Besides, the submount further comprises the circuit layout electrically connected to the electrode of the white light LED.

SUMMARY OF THE DISCLOSURE

The present disclosure provides a method of making a light-emitting device and a light-emitting device made thereof.

The method of making a light-emitting device including preparing a plurality of light-emitting units, one of the plurality of light-emitting units comprising an electrode, a light-emitting stack, and a protection layer having a first part covering the electrode and a second part which comprises a portion surrounding the electrode and covers the light-emitting stack; removing the portion without removing the first part; forming a wavelength conversion layer on the first part and the light-emitting stack not covered by the second part; and removing the first part to substantially expose the electrode.

The present disclosure also provides a method of making a light-emitting device.

The method of making a light-emitting device including preparing a plurality of light-emitting units which are connected to each other, one of the plurality of light-emitting units comprising an electrode, a light-emitting surface connected to the electrode, and a protection layer having a first part and a second part which covers the light-emitting surface; removing the second part to expose the light-emitting surface without removing the first part; forming a wavelength conversion layer on the first part and the light-emitting surface; and removing the first part to expose the electrode.

BRIEF DESCRIPTION OF THE DRAWING

The accompanying drawing is included to provide easy understanding of the application, and is incorporated herein and constitutes a part of this specification. The drawing illustrates the embodiment of the application and, together with the description, serves to illustrate the principles of the application.

DETAILED DESCRIPTION OF THE EMBODIMENTS

The following shows the description of embodiments of the present disclosure in accordance with the drawing.

FIGS. 1A to 1K disclose a method of making a plurality of light-emitting devices 100 according to one embodiment of the present disclosure.

Figure 1A:
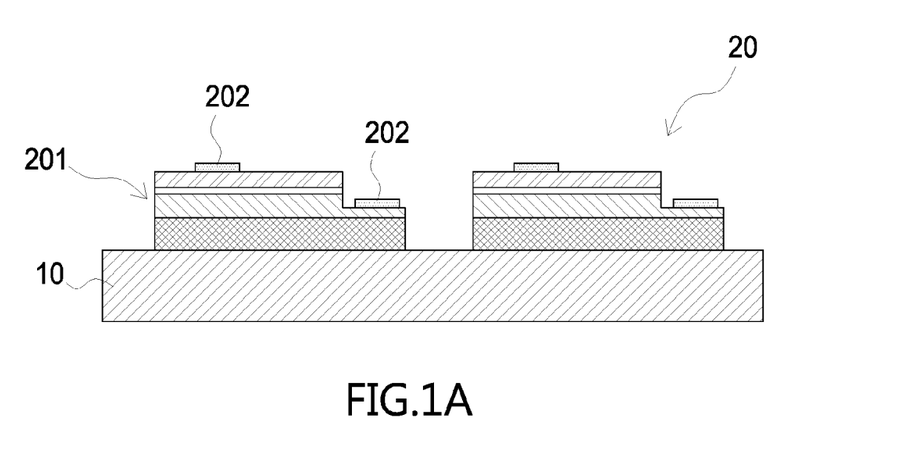
FIGS. 1A to 1K are cross-sectional views showing a method of making a light-emitting device in accordance with the first embodiment of the present disclosure.
Figure 1B:
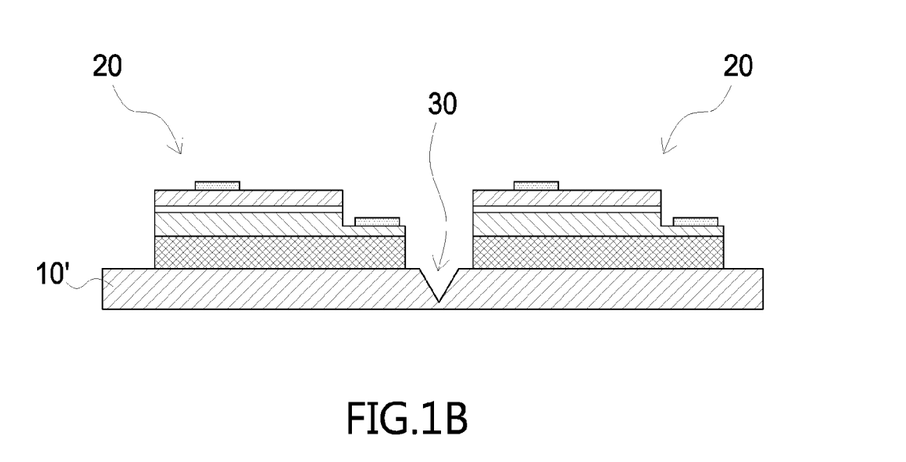
Figure 1C:
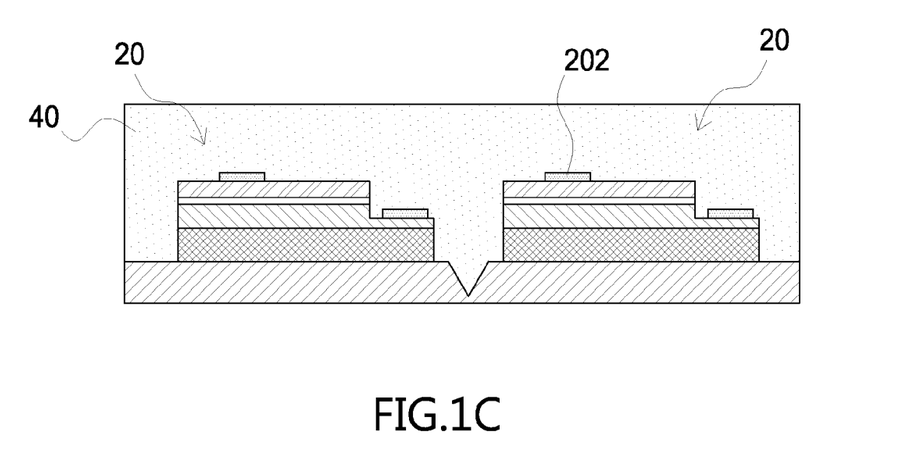
Figure 1D:
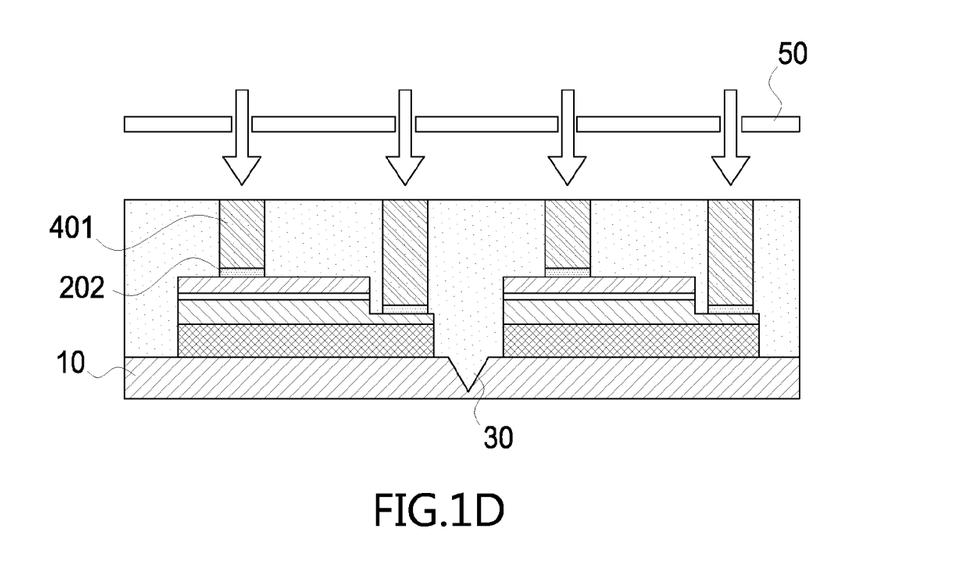
Figure 1E:
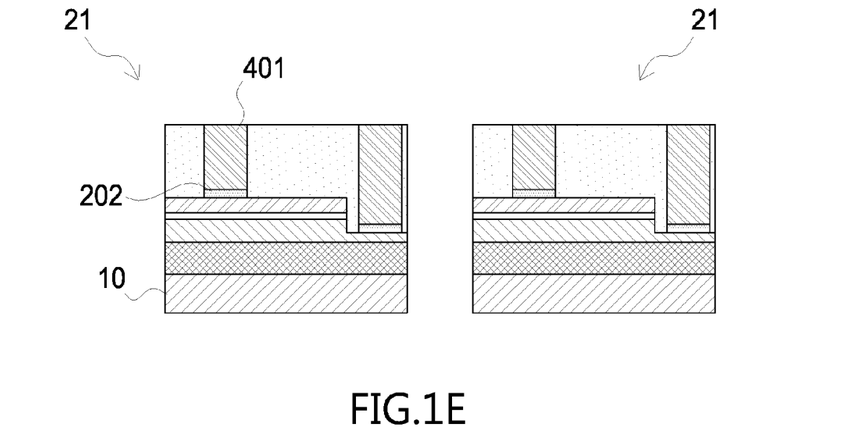
Figure 1F:
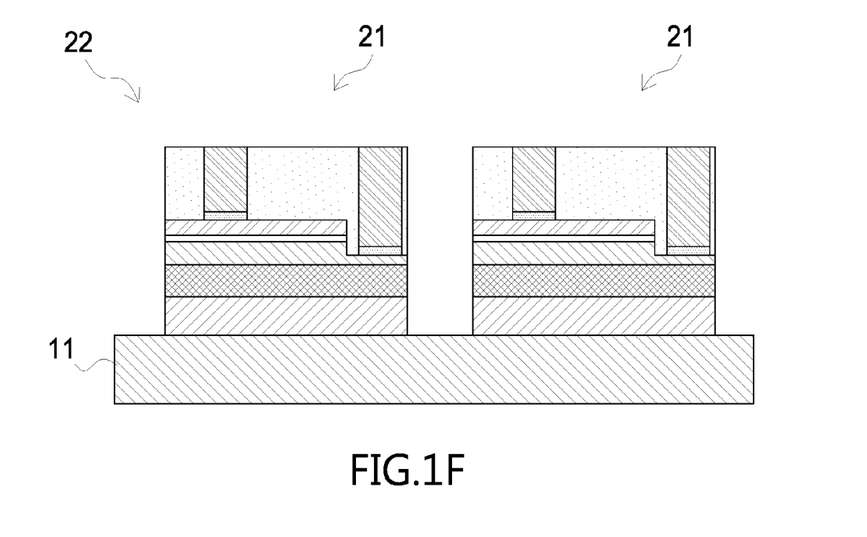
Figure 1G:
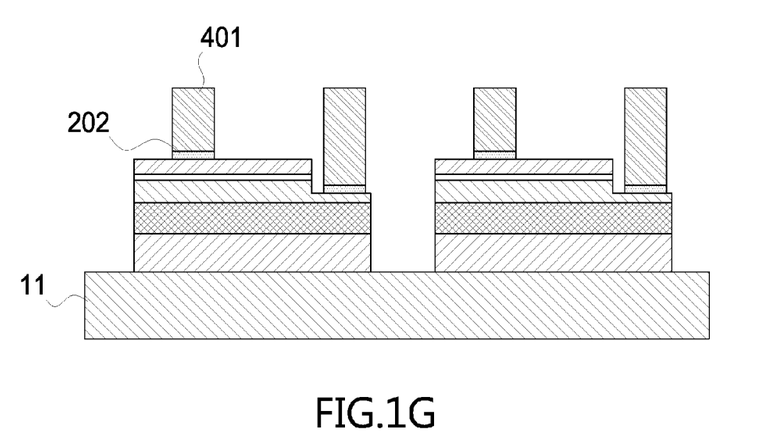
Figure 1H:
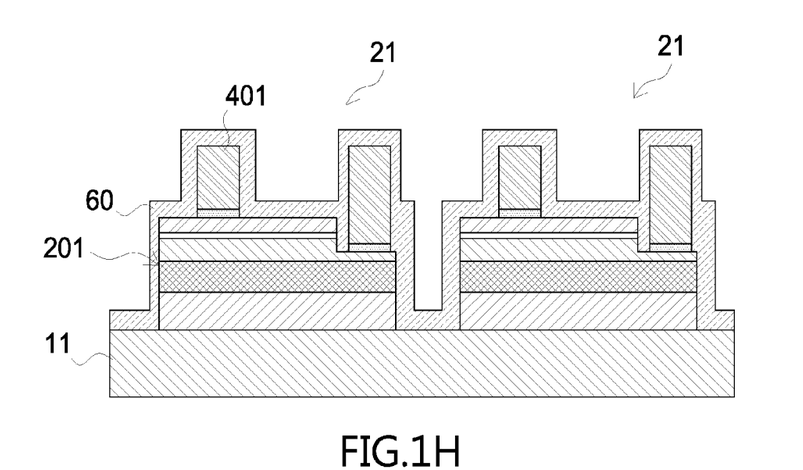

Referring to FIG. 1A, a plurality of light-emitting units 20 are formed on a single wafer 10. Each of the light-emitting units 20 comprises an epitaxial structure 201 and a pair of electrodes 202 formed on the epitaxial structure 201. In this embodiment, a horizontal-type light-emitting unit is shown, but a vertical-type light-emitting unit or other type can be included therein. Referring to FIG. 1B, a trench 30 is formed in the single wafer 10 between two adjacent light-emitting units 20 and the single wafer 10 is thinned to form a thinned wafer 10'. Subsequently, opto-electrical characteristics (such as emission wavelength, optical power, forward voltage (Vf), and reverse current (Ir)) for each light-emitting unit 20 are measured. Referring to FIG. 1C, a protection layer 40 is formed on and covers entirely the light-emitting units 20. In this embodiment, the protection layer 40 is a photoresist. Referring to FIGS. 1D and 1E, the photoresist is exposed using a mask 50 such that the photoresist on the electrode 202 is modified like being hardened and remained after subsequent developing process. The light-emitting units 20 are separated along the trench 30 into a plurality of light-emitting chips 21. Each of the light-emitting chips 21 has the modified photoresist 401 on the electrodes 202. Referring to FIG. 1F, based on the measured opto-electrical characteristics, the light-emitting chips 21 are classified (or sorted or collected) into a plurality of light-emitting groups 22 such that each of the light-emitting groups 22 comprises the light-emitting chips 21 having at least one substantially the same emission wavelength, substantially the same optical power and substantially the same forward voltage. In one embodiment, a difference of the emission wavelength between the light-emitting chips 21 in each of the light-emitting groups 22 is smaller than 10 nm, a difference of the optical power between the light-emitting chips 21 in each of the light-emitting groups 22 is not greater than 10% and a difference of the forward voltage in each of the light-emitting groups 22 is less than 0.4 V. One of the light-emitting group 22 is shown in FIG. 1F and the light-emitting group 22 is attached to a temporary substrate 11. It is noted that the light-emitting group 22 comprises the light-emitting chips 21 from the same wafer. Alternatively, the light-emitting group 22 can comprise light-emitting chips from different wafers while the light-emitting chips 21 have the same opto-electrical characteristics. Referring to FIG. 1G, after developing the photoresist, the non-modified photoresist is removed and the modified photoresist 401 is left on the electrodes 202. Referring to FIG. 1H, a wavelength converted layer 60 is formed to cover entirely and conformally the light-emitting chips 21 comprising the modified photoresist 401 and the epitaxial structure 201. The wavelength converted layer 60 is used for converting the light generated from the light-emitting chip 21 into a converted light having a wavelength different from the wavelength of the light emitting from the light-emitting chip 21. The converted light is mixed with the light generated from the light-emitting chip 21 to obtain a white light or other color light.

Figure 1I:
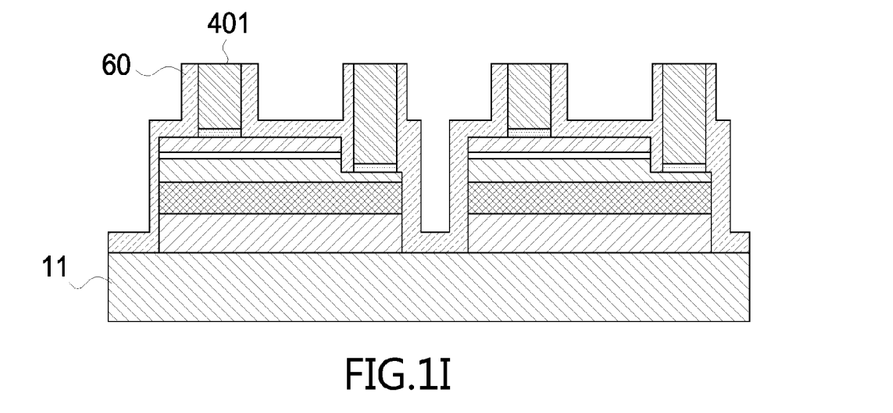
Figure 1J:
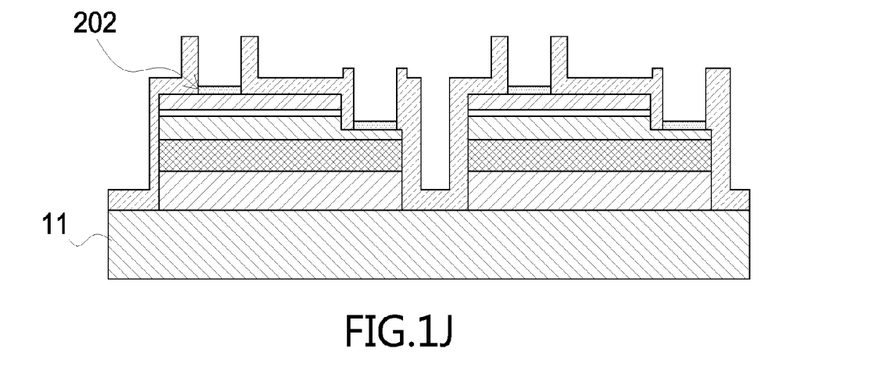
Figure 1K:
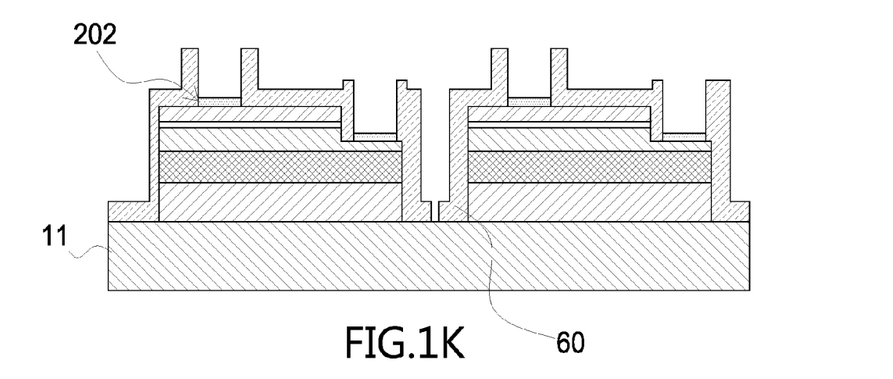

Referring to FIG. 1I, the wavelength converted layer 60 on the modified photoresist 401 is removed to expose the modified photoresist 401. In one embodiment, the wavelength converted layer 60 is removed by gridding (polishing) or tape lift-off. Referring to FIG. 1J, the modified photoresist 401 is further removed to expose the electrodes 202. In this embodiment, the modified photoresist 401 is removed by a solvent such as acetone or N-Methyl-2-Pyrrolidone (NMP). Referring to FIG. 1K, the wavelength converted layer 60 on the temporary substrate 11 between two adjacent ones of the light-emitting chips 21 is separated by laser or diamond blade. Then, the temporary substrate 11 is removed from the light-emitting chips 21 and the light-emitting chip 21 is mounted on a carrier (not shown). Alternatively, the wavelength converted layer 60 on the temporary substrate 11 can be separated prior to removal of the modified photoresist 401. A metal bump (not shown) is further formed on the electrodes 202 for electrically connecting with an external power source (not shown) through wires. In another embodiment, the protection layer is an electroplated metal layer (such as copper or nickel) and therefore the wires are electrically coupled with the electrodes through the protection layer without removing the protection layer. The protection layer has a height ranging from 30 μm to 150 μm.

Figure 2A:
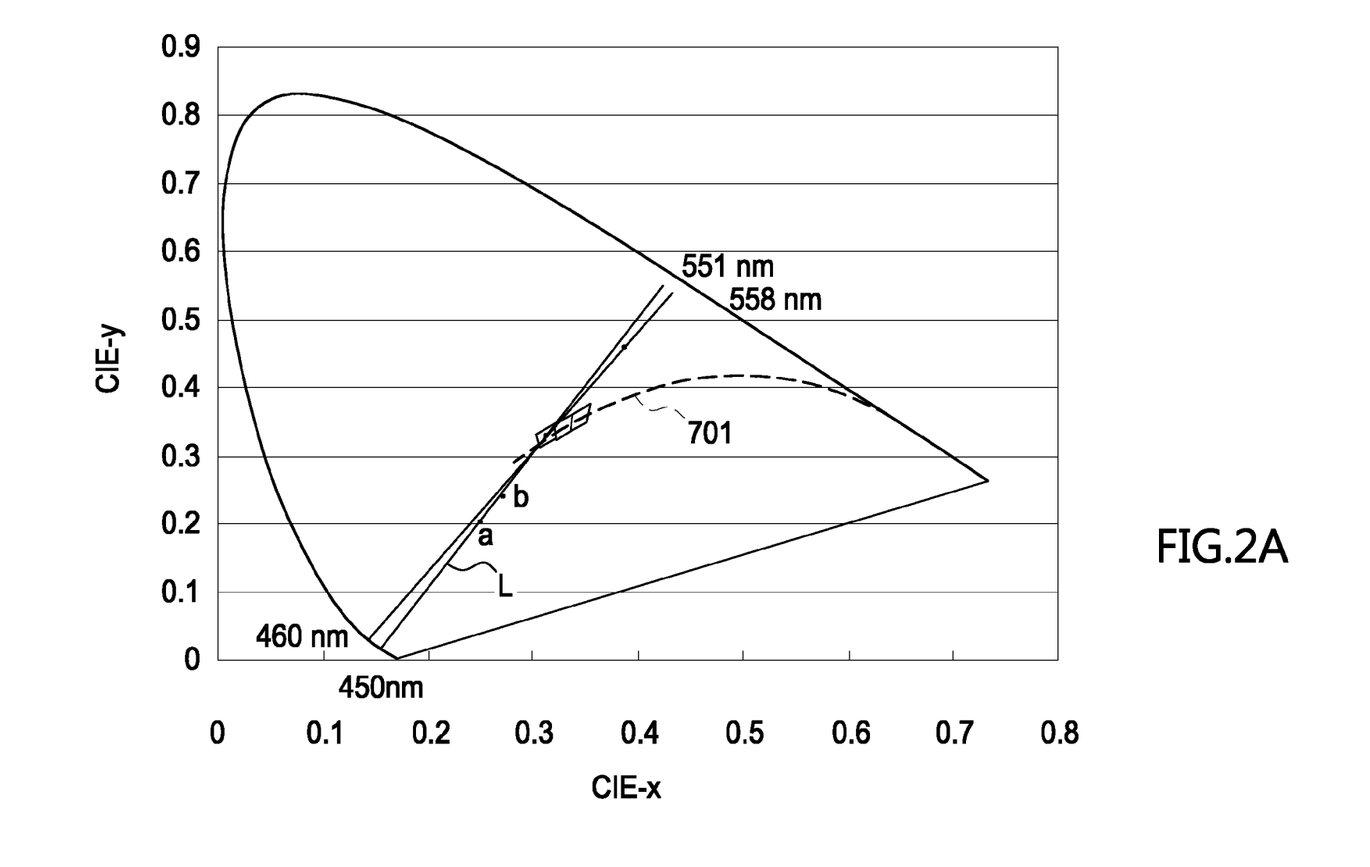
FIG. 2A shows a chromaticity diagram showing emission characteristics of the light-emitting device in accordance with the present disclosure.
Figure 2B:
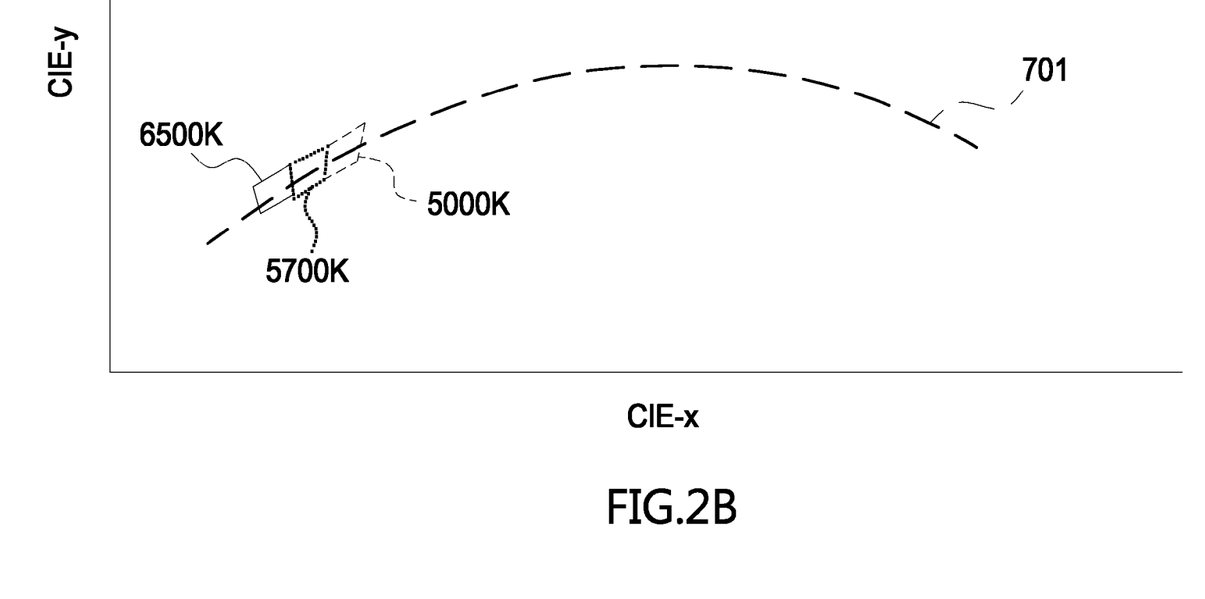
FIG. 2B is a chromaticity diagram showing a black body curve.

FIG. 2A shows a CIE 1931 chromaticity diagram. FIG. 2B shows the blackbody curve 701, and there are seven color temperature regions (7-step MacAdam ellipse) (only three color temperature regions are shown in FIGS. 2A and 2B), and the center point (for example, 5000K, 5700K, 6500K) of each of the seven color temperature regions is near the blackbody curve 701. Each of the color temperature regions is defined by four CIE points to form a quadrangle (shown in Table 1).

TABLE 1

|  | 5000 | | 5700 | | 6500 | |
| --- | --- | --- | --- | --- | --- | --- |
|  | x | y | x | y | x | y |
| center point | 0.3447 | 0.3553 | 0.3287 | 0.3417 | 0.3123 | 0.3282 |
| tolerance | 0.3551 | 0.376 | 0.3376 | 0.3616 | 0.3205 | 0.3481 |
| quadrangle | 0.3376 | 0.3616 | 0.3207 | 0.3462 | 0.3028 | 0.3304 |
|  | 0.3366 | 0.3369 | 0.3222 | 0.3243 | 0.3068 | 0.3113 |
|  | 0.3515 | 0.3487 | 0.3366 | 0.3369 | 0.3221 | 0.3261 |

Generally, in this embodiment, the light generated by the light-emitting chip is mixed with the converted light converted by the wavelength converted layer to generate a white light having a CIE coordinate within the seven color temperature regions. It is noted that, since each of the light-emitting groups has different emission wavelength, the light-emitting groups are required to be covered by different wavelength converted layers emitting different light that each light can be defined by a CIE coordinate, thereby obtaining white light within one color temperature region. To be more specific, the light converted by different wavelength converted layers can have different main emission peak wavelength while having the same CIE coordinate. For example, when a first light-emitting group comprises the light-emitting chips having a main emission wavelength of about 450 nm, and a second light-emitting group comprises the light-emitting chips having a main emission wavelength of about 460 nm, a first wavelength converted layer emitting a light that has a first CIE coordinate (x=0.426, y=0.548) is adopted in the first light-emitting group to generate a first white light, and a second wavelength converted layer emitting a light that has a second CIE coordinate (x=0.444, y=0.536) is adopted in the second light-emitting group to generated a second white light. The first and the second white light have a CIE coordinate in the same color temperature region (for example, the region having a center point of 6500 k). In this embodiment, the first wavelength converted layer with the first CIE coordinate has a main emission peak wavelength of 551 nm, and the second wavelength converted layer with the second CIE coordinate has a main emission peak wavelength of 558 nm. Alternatively, the first wavelength converted layer having a main emission peak wavelength of 554 nm can emit a light having the first CIE coordinate (x=0.426, y=0.548), and the second wavelength converted layer having a main emission peak wavelength of 560 nm can emit a light having the second CIE coordinate (x=0.444, y=0.536). In this embodiment, a thickness of the wavelength converted layer on the first light-emitting group is substantially the same as that on the second light-emitting group.

Furthermore, as shown in FIG. 2A, a thickness of the wavelength converted layer may be different on different light-emitting group. In this embodiment, Line L indicates the color point of the light-emitting chip having the main emission peak wavelength of 450 nm in combination with the wavelength converted layer having the main emission peak wavelength of 551 nm (yellow color). A color point is varied along the Line L while a thickness of the converted wavelength layer on the light-emitting chip is varied. The thinner thickness of the converted wavelength layer indicates a color point along the Line L closer to the color point of the light-emitting chip. For example, each of a third light-emitting group and a fourth light-emitting group includes the light-emitting chips having a main emission wavelength of 450 nm. A wavelength converted layer having a main emission peak wavelength of 551 nm is adopted in the third and the fourth light-emitting groups. The wavelength converted layer on the third light-emitting group has a first thickness to emit a mixed light having a first CIE coordinate (point a) and the wavelength converted layer on the fourth light-emitting group has a second thickness to emit a mixed light having a second CIE coordinate (point b). The second thickness is greater than the first thickness.

Figure 3A:
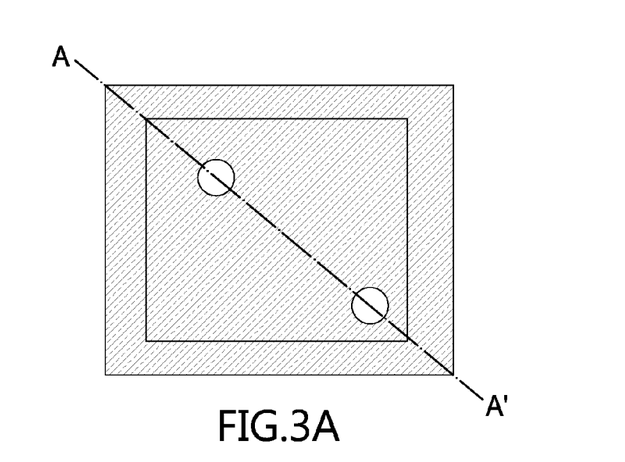
FIG. 3A is a plan view of a light-emitting device made by the method in accordance with the first embodiment of the present disclosure.
Figure 3B:
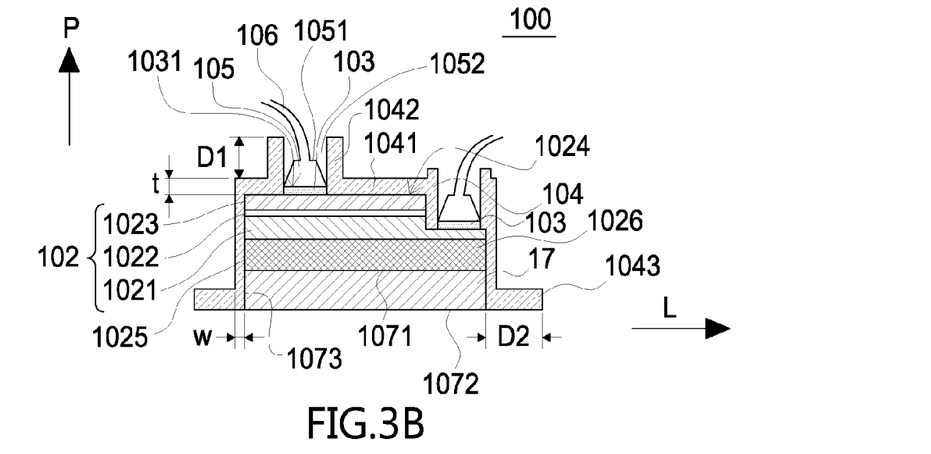
FIG. 3B is a cross-sectional view of the light-emitting device, taken along line AA' of FIG. 3A.

FIG. 3A shows a plan view of a light-emitting device 100 made by the method in accordance with the first embodiment of the present disclosure, and FIG. 3B shows a cross-sectional view of the light-emitting device 100, taken along line AA' of FIG. 3A. The light-emitting device 100 comprises a substrate 17, a light-emitting stack 102, a pair of electrodes 103 and a wavelength converted layer 104. The substrate 17 has a top surface 1071, a bottom surface 1072, and four side regions 1073 between the top and bottom surfaces 1071, 1072. The light-emitting stack 102 is formed on the top surface 1071. The light-emitting stack 102 comprises a buffer layer 1026, an n-type semiconductor layer 1021 on the buffer layer 1026, an active layer 1022 formed on the n-type semiconductor layer 1021, and a p-type semiconductor layer 1023 formed on the active layer 1022. The pair of electrodes 103 is formed on the n-type semiconductor layer 1021 and the p-type semiconductor layer 1023 respectively. The wavelength converted layer 104 has a first portion 1041 covering a top region 1024 of the light-emitting stack 102 and a second portion 1042 protruding from a portion of the first portion 1041 with a first distance (D1) in a first direction (P). In the embodiment, the second portion 1042 does not protrude from an entire surface of the first portion 1041. The second portion 1042 has a width (along a second direction (L)) less than that of the first portion 1041. The first distance (D1) ranges from 10 μm to 70 μm. Furthermore, the light-emitting stack 102 has four side regions 1025, and the wavelength converted layer 104 entirely covers the four side regions 1003, 1025 of the substrate 10 and the light-emitting stack 102. The wavelength converted layer 104 further has a protruding portion 1043 protruding from the side region 1003 of the substrate 10 with a second distance (D2) in the second direction (L). The second distance (D2) is 30-100 μm. The first direction (P) is substantially perpendicular to the second direction (L). In one embodiment, the wavelength converted layer 104 on the side region 1073, 1025 has a width (w) smaller than a thickness (t) of the wavelength converted layer 104 on the top region 1024. The thickness (t) is 20-100 μm and the width (w) is 10-90 μm. In other embodiment, the width (w) is substantially equal to the thickness (t). A height of the electrode 103 is less than that of the first portion 1041 of the wavelength converted layer 104. A metal bump 105 is formed on the electrode 103. The metal bump 105 further has a top surface 1051 and a sidewall 1052. The second portion 1042 of the wavelength converted layer 104 surrounds the sidewall 1052 without covering the top surface 1051 of the metal bump 105. The metal bump 105 has a trapezoid shape in cross section. Alternatively, the shape of the metal bump can be round or rectangular. In this embodiment, the wavelength converted layer 104 does not cover a top surface 1031 of the electrode 103. In other embodiment, the wavelength converted layer 104 can cover a sidewall of the electrode 103 and portions of the top surface 1031 of the electrode 103. Therefore, the metal bump 105 has a footprint area less than the area of the electrode 103. The metal bump 105 comprises gold, copper, silver, or aluminum. A wire 106 is electrically connected with the metal bump 105, and the wavelength converted layer 104 is not formed on the wire. The wire comprises gold, copper, silver, or aluminum.

Figure 4:
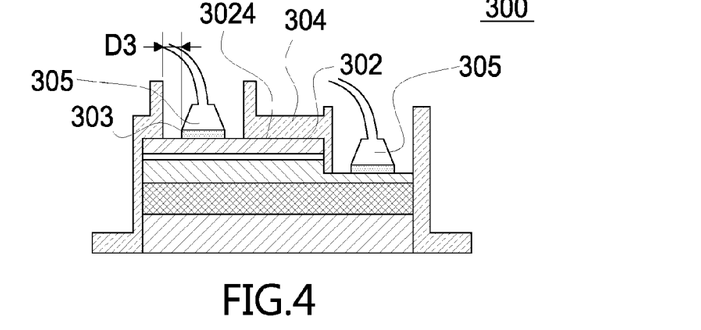
FIG. 4 is a cross-sectional view of a light-emitting device made by the method in accordance with a second embodiment of the present disclosure.

Referring to FIG. 4, a light-emitting device 300 made by the method in accordance with a second embodiment of the present disclosure is disclosed. As to the method of the first embodiment, a plurality of light-emitting units 20 are formed on a single wafer 10 (shown in FIG. 1A). Each of the light-emitting units 20 comprises an epitaxial structure 201 and a pair of electrodes 202 formed on the epitaxial structure 201. A trench 30 is formed in the single wafer 10 between two adjacent light-emitting units 20 and the single wafer 10 is thinned to form a thinned wafer 10' (shown in FIG. 1B). Subsequently, opto-electrical characteristics (such as emission wavelength, optical power, forward voltage (Vf), and reverse current (Ir)) for each light-emitting unit 20 are measured. A protection layer 40 is formed on and covers entirely the light-emitting units 20 (shown in FIG. 1C). However, when the photoresist layer 40 is exposed with the mask 50, since the mask 50 has a size larger than the electrode 202, the modified photoresist 401 covers the sidewall of the electrode 103. Accordingly, the wavelength converted layer 304 does not cover the sidewall of the electrode 103 and is spaced apart from the electrode 303 after the modified photoresist 401 is removed. In this embodiment, the wavelength converted layer 304 covering the top region 3024 of the light-emitting stack 302 is spaced apart from the electrode 303 with a third distance (D3) ranging from 1 μm to 20 μm for facilitating the forming of the metal bump 305 on the electrode 303. In one embodiment, the metal bump 305 has an area less than or equal to the electrode 303.

The light-emitting device can be composed of several materials such as the series of aluminum gallium indium phosphide (AlGaInP), the series of aluminum gallium indium nitride (AlGaInN), and/or the series of zinc oxide (ZnO). The active layer can be configured to be a single heterostructure (SH), a double heterostructure (DH), a double-side double heterostructure (DDH), or a multi-quantum well (MWQ) structure. Besides, the wavelength of the emitted light could be controlled by changing the number of the pairs of the quantum well.

The material of the substrate(s) used for growing or supporting the light-emitting structure unit(s) can include but does not limit to germanium (Ge), gallium arsenide (GaAs), indium phosphide (InP), sapphire, silicon carbide (SiC), silicon (Si), lithium aluminium oxide (LiAlO$_2$), zinc oxide (ZnO), gallium nitride (GaN), aluminum nitride (AlN), glass, composite, diamond, CVD diamond, diamond-like carbon (DLC) and any combination thereof. The wavelength converted layer is phosphor, for example, Y$_3$Al$_5$O$_{12}$. Besides, the wavelength converted layer can also be Gd$_3$Ga$_5$O$_{12}$:Ce, (Lu,Y)$_3$Al$_5$O12:Ce, SrS:Eu, SrGa$_2$S$_4$:Eu, (Sr,Ca,Ba)(Al,Ga)$_2$S$_4$:Eu, (Ca,Sr)S:Eu,Mn, (Ca,Sr)S:Ce, (Sr,Ba,Ca)$_2$Si$_5$N$_8$:Eu, (Ba,Sr,Ca)$_2$SiO$_4$:Eu, (Ca,Sr,Ba)Si$_2$O$_2$N$_2$:Eu, and CdZnSe.

The foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A method of making a light-emitting diode, comprising:
    preparing a plurality of light-emitting units, one of the plurality of light-emitting units comprising an electrode, a light-emitting stack, and a protection layer having a first part covering the electrode and a second part which comprises a portion surrounding the electrode and covers the light-emitting stack;

separating the plurality of light-emitting units into a plurality of light-emitting chips after the first part covering the electrode;

removing the portion without removing the first part;

forming a wavelength conversion layer on the first part and the light-emitting stack not covered by the second part; and removing the first part to substantially expose the electrode.

2. The method of claim 1, wherein the plurality of light-emitting chips have an emission wavelength difference smaller than 10 nm.

3. The method of claim 1, wherein the plurality of light-emitting chips have a forward voltage difference less than 0.4V.

4. The method of claim 1, wherein the plurality of light-emitting units are commonly formed on a wafer.

5. The method of claim 1, wherein the plurality of light-emitting units comprises a first light-emitting unit formed on a first wafer, and a second light-emitting unit formed on a second wafer.

6. The method of claim 1, wherein the step of removing the first part comprises partially removing the wavelength conversion layer.

7. The method of claim 1, wherein the step of removing the first part comprises substantially removing all the protection layer.

8. The method of claim 1, wherein the second part is removed before forming the wavelength conversion layer.

9. The method of claim 1, wherein the electrode is surrounded by the wavelength conversion layer.

10. The method of claim 1, wherein the electrode has a top surface which is entirely exposed at the removing step.

11. The method of claim 1, wherein the electrode comprises a top surface being entirely covered by the first part before removing the first part.

12. A method of making a light-emitting diode, comprising:

preparing a plurality of light-emitting units which are connected to each other, one of the plurality of light-emitting units comprising an electrode, a light-emitting surface connected to the electrode, and a protection layer having a first part and a second part which covers the light-emitting surface;

removing the second part to expose the light-emitting surface without removing the first part;

forming a wavelength conversion layer on the first part and the light-emitting surface; and removing the first part to expose the electrode.

13. The method of claim 12, further comprising singularizing the plurality of light-emitting units covered by the wavelength conversion layer to form one or more light-emitting diodes.

14. The method of claim 12, wherein the electrode has a top surface which is entirely exposed after removing the first part.

15. The method of claim 12, wherein the second part is removed before forming the wavelength conversion layer.

16. The method of claim 12, wherein the step of removing the first part comprises partially removing the wavelength conversion layer.

* * * * *